United States Patent
Sakurai et al.

[11] Patent Number: 5,446,017
[45] Date of Patent: Aug. 29, 1995

[54] SUPERCONDUCTIVE COPPER-CONTAINING OXIDE MATERIALS OF THE FORMULA $A_pB_qCu_2O_{4\pm r}$

[75] Inventors: Takeshi Sakurai, Yono; Nobuyuki Sugii, Tokyo; Seiji Adachi, Urayasu; Michiharu Ichikawa, Yokosuka; Yuji Yaegashi, Sendai; Hisao Yamauchi, Nagareyama; Masahiko Shimada; Hirotsugu Takizawa, both of Sendai, all of Japan

[73] Assignees: Central Research Institute of Electric Power Industry; Tohoku Electric Power Co., Inc.; International Superconductivity Technology Center, all of Japan

[21] Appl. No.: 45,077

[22] Filed: Apr. 12, 1993

[30] Foreign Application Priority Data

Aug. 31, 1992 [JP] Japan .................. 4-257174

[51] Int. Cl.$^6$ ............... H01B 12/00; H01L 39/12
[52] U.S. Cl. ................... 505/125; 505/100; 505/125; 505/775; 423/593; 252/518; 252/521
[58] Field of Search .......... 505/100, 775, 776, 125; 423/593; 252/518, 519, 521

[56] References Cited

U.S. PATENT DOCUMENTS 5,372,990 12/1994 Nobumasa et al. ............. 505/125

OTHER PUBLICATIONS

Takano "Superconductivity in the Ba—Sr—Cu—O system" *Physica C* v. 176 Jun. 1, 1991 pp. 441–444.
Li "Epitaxial growth and properties of $Ca_{1-x}Sr_xCuO_2$ . . ." *Jap. Jnl. Appl. Phys.* v. 31 (II, 3A) Mar. 1, 1992, pp. L217–220.
Adachi "High-pressure synthesis of superconducting Sr—Ca—Cu—O samples." *Physica C* 208 Apr. 10, 1993 pp. 226–230.
Gambardella "Substitution of Calcium for strontium in the $SrCuO_2$ . . ." *Mat Res Bull* v. 27 May 1992 pp. 629–636.
Li "Observation of resistive and magnetic anomalies . . ." *Jap. Jnl. Appl. Phys.* v. 31 (7B) Jul. 15, 1992, L. 934–7.

Primary Examiner—Paul Lieberman
Assistant Examiner—M. Kopec
Attorney, Agent, or Firm—Lorusso & Loud

[57] ABSTRACT

A superconductive oxide material having an infinite layer structure and having the following formula:

$$A_pB_qCu_2O_{4\pm r}$$

wherein A and B are different and each represent an element selected from lanthanoid elements and elements belonging to Groups IA, IIA and IIIA of the Periodic Table, p is between 0.9 and 1.1, q is between 0.9 and 1.1 and r is between 0 and 0.6. The oxide material has a crystal structure belonging to a tetragonal system of P4/mmm and I-123 having the following lattice parameters:

$$3.8 Å \leq a \leq 4.0 Å$$

$$7.6 Å \leq c \leq 8.0 Å$$

or to an orthorhombic system of Pmmm and I-47 having the following lattice parmeters:

$$3.8 Å \leq a \leq 3.95 Å$$

$$3.82 Å \leq b \leq 4.0 Å$$

$$7.6 Å \leq c \leq 8.0 Å.$$

5 Claims, 24 Drawing Sheets

FIG. 1
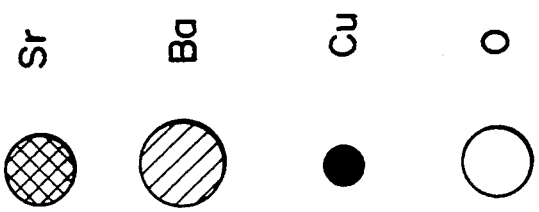
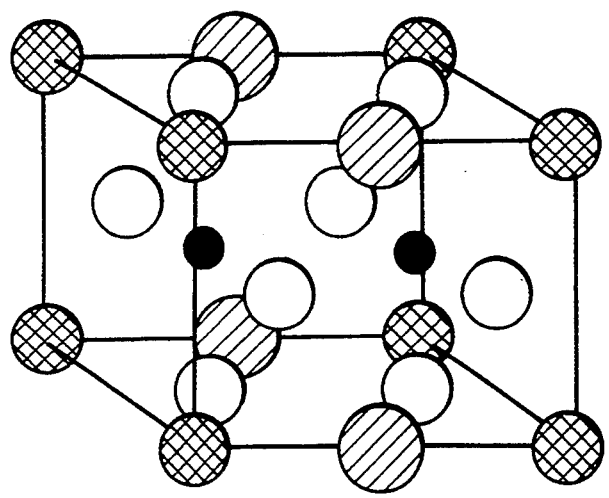
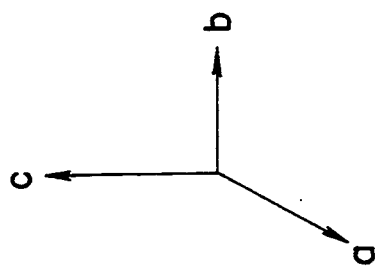

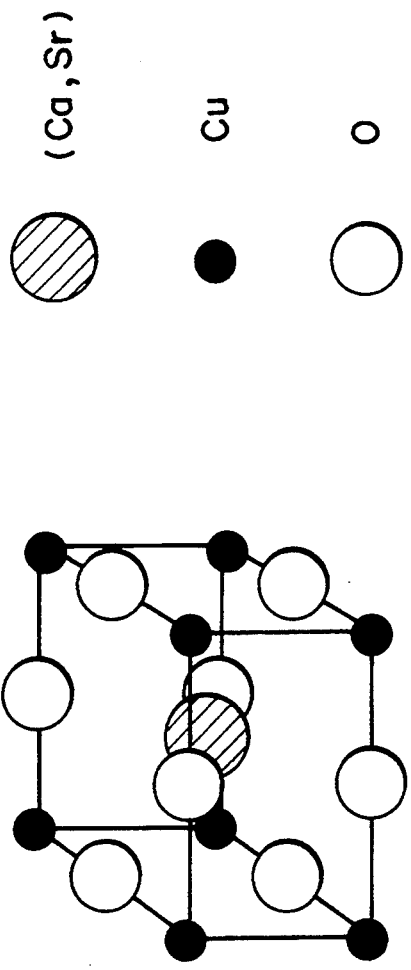
FIG. 2
PRIOR ART
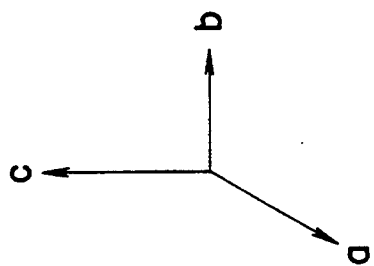

F I G. 3
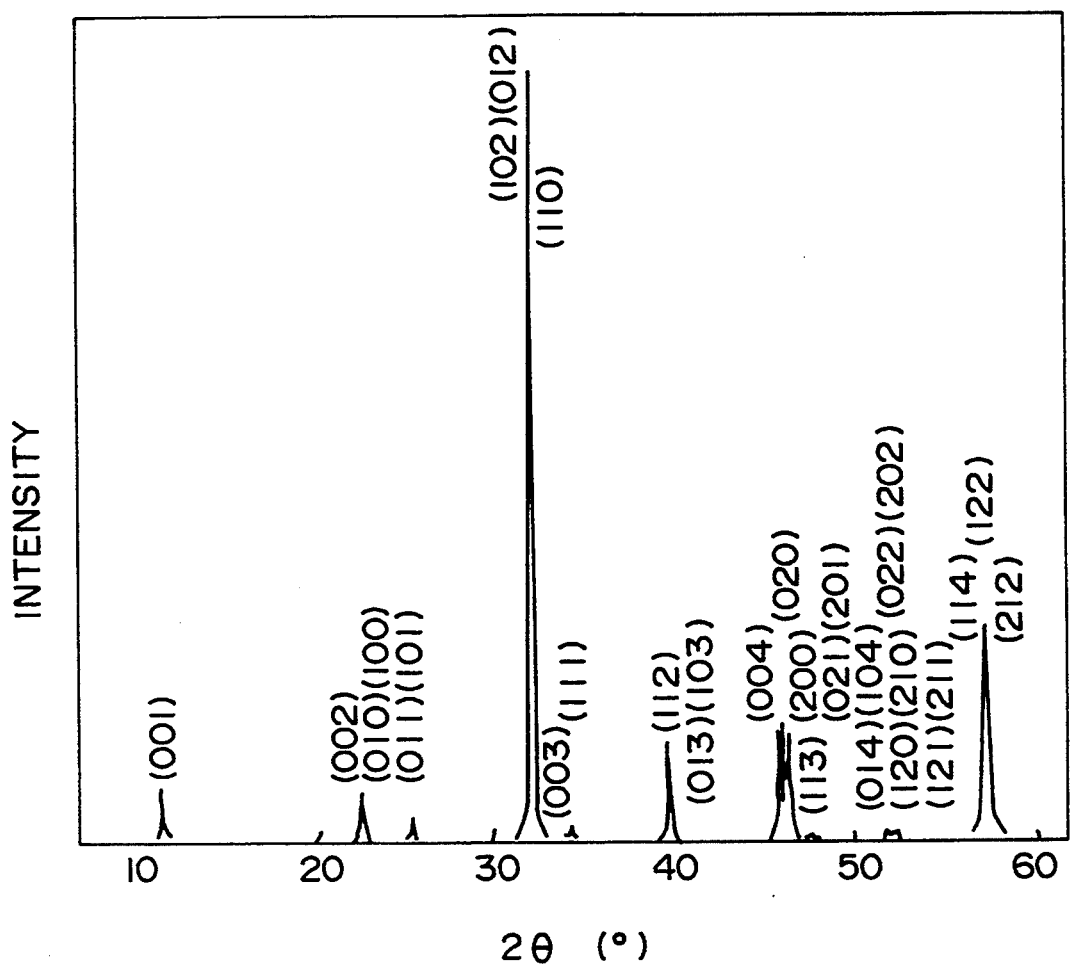

F I G. 9
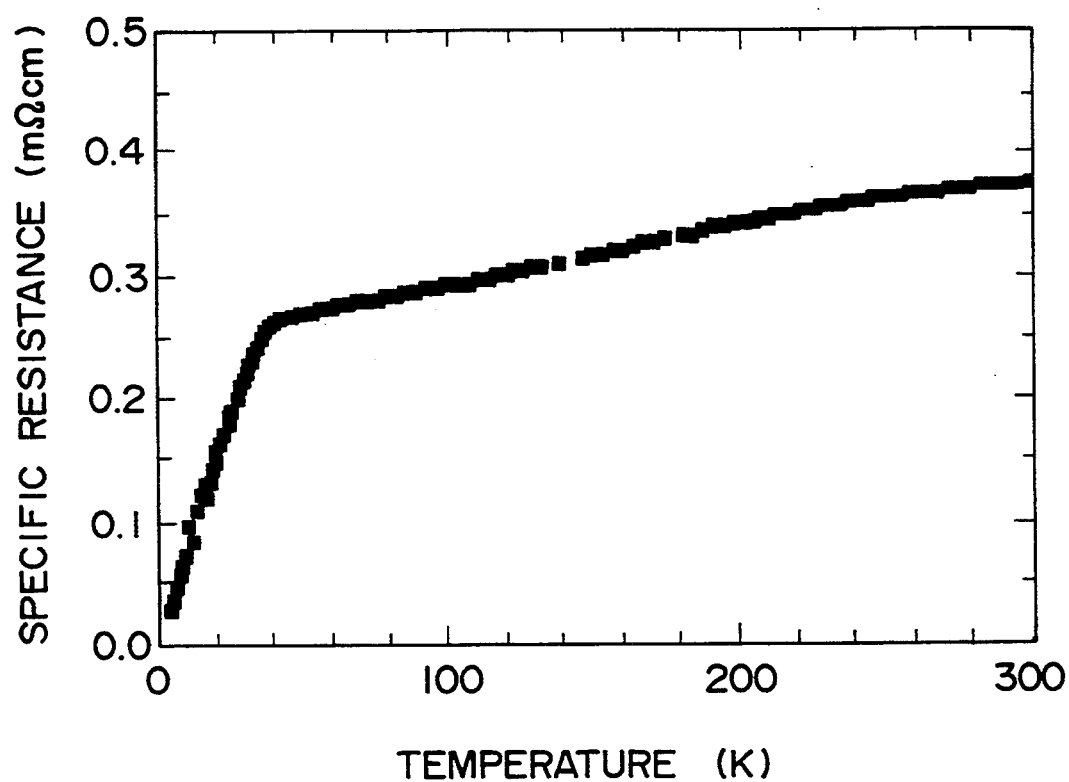

F I G. 12
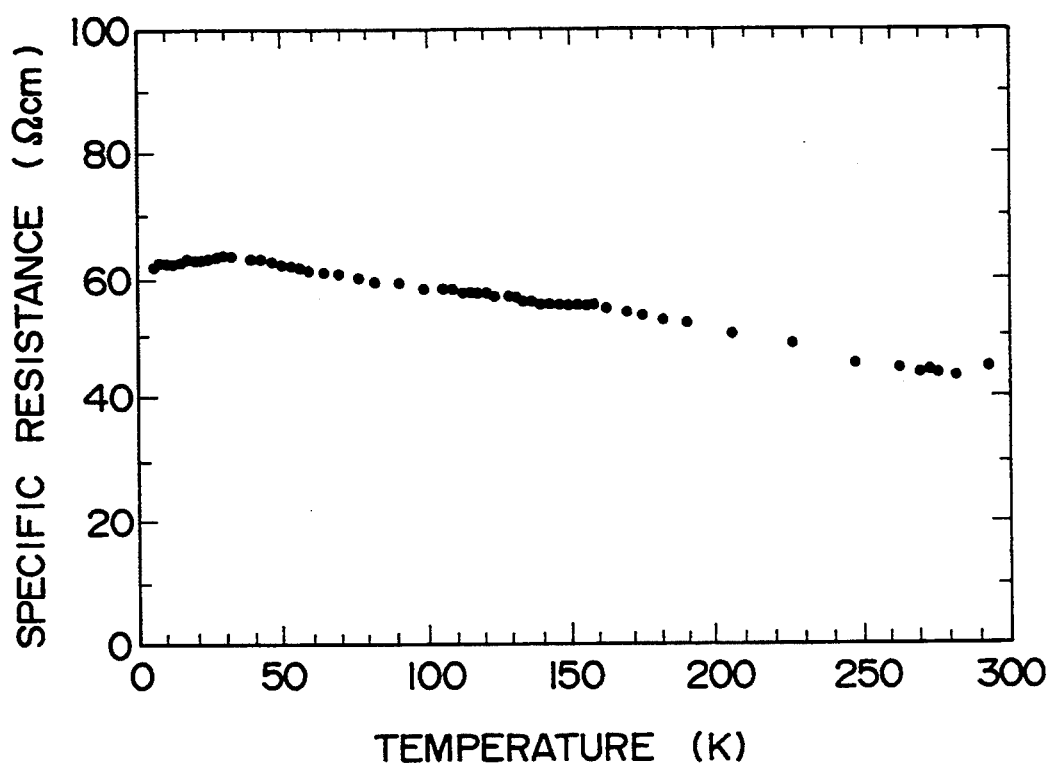

F I G. 14
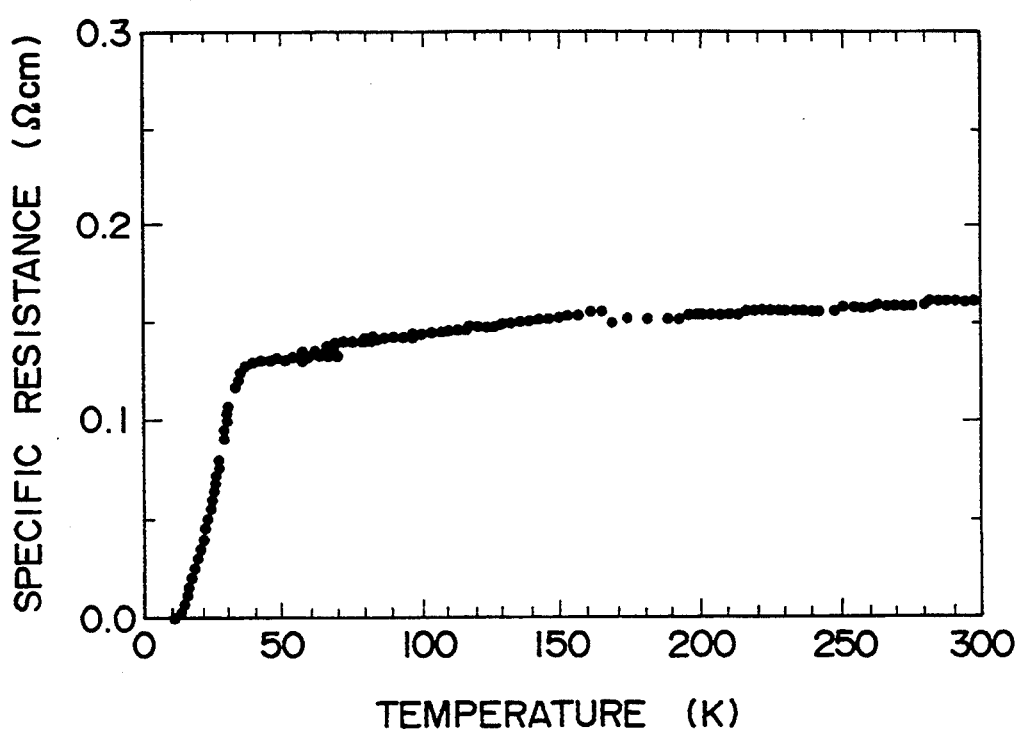

// # SUPERCONDUCTIVE COPPER-CONTAINING OXIDE MATERIALS OF THE FORMULA $A_pB_qCU_2O_{4\pm r}$

BACKGROUND OF THE INVENTION

1. Field of the Invention

This invention relates to a copper-containing oxide material useful as a superconductor or as a parent phase convertible to a superconductor by carrier doping. 2.

2. Description of the Prior Art

One known oxide having an infinite layer crystal structure is of a (Ca, Sr)CuO$_2$ system as shown in FIG. 2 which is produced at a super-high pressure of 60,000 atm and a high temperature of 1,000° C. or more (M. Takano et al, Physica C 159, 375(1989)). The illustrated structure contains one CuO$_2$ plane and one cation plane in the unit cell. The cation cite is occupied by a plurality of atoms in the form of a solid solution. Under ambient pressure, an oxide with such an infinite layer structure must be prepared at a temperture of 950°–1,150° C. and, therefore, only available is an oxide of the formula Ca$_{0.84}$Sr$_{0.16}$CuO$_2$ (T. Siegrist et al, Nature 334, 231 (1988)). This oxide, which contains a CuO$_2$ plane commonly included in ceratin superconductors, was expected to be a mother phase convertible to a superconductive material upon carrier doping. However, superconductor derived from the oxide has not yet been produced because of difficulties in element substitution.

There are some reports disclosing that superconducting oxides having an infinite layer structure may be produced at a super-high pressure of 20,000–60,000 atm. Namely, the sintering of a composition of Nd$_x$Sr$_{1-x}$CuO$_2$ ($0.14 \leq X \leq 0.16$) at 25,000 atm and below 1,000° C. gives a superconductor having Tc of 40K. (M. G. Smith et al, Nature 351, 549 (1991)). An infinite layer superconductor of the Ba-Sr-Cu-O system is produced by a similar high pressure technique (M. Takano et al, Physica C 176, 441 (1991)). In these methods, a super-high pressure is used to extend the solid solution limit of the crystallographic phase and, thereby, to control the atoms entering the cation site located between the two CuO$_2$ planes.

It is reported that cation orderings are important to obtain superconductivity of a compound such as (La, Sr)$_2$CaCu$_2$O$_6$ (T. Sakurai et al, Physica C 174, 187 (1991)).

SUMMARY OF THE INVENTION

In accordance with the present invention there is provided an oxide material having the following formula:

$$A_pB_qCu_2O_{4\pm r}$$

wherein A represents an element selected from the group consisting of lanthanoid elements and elements belonging to Groups IA, IIA and IIIA of the Periodic Table, B is an element different from element A and selected from the group consisting of lanthanoid elements and elements belonging to Groups IA, IIA and IIIA of the Periodic Table, and p, q and r are numbers in the following ranges:

$$0.9 \leq p \leq 1.1$$

$$0.9 \leq q \leq 1.1$$

$$0 \leq r \leq 0.6.$$

In one aspect, the oxide material has a crystal structure which belongs to a tetragonal system of P4/mmm and I-123 and which has the following lattice parameters:

$$3.8\text{Å} \leq a \leq 4.0\text{Å}$$

$$7.6\text{Å} \leq c \leq 8.0\text{Å}$$

the oxide material having an infinite layer structure composed of the following recurring unit:

CuO$_2$ plane—single layer cation site A(1)-CuO$_2$ plane—single layer cation site A(2), wherein said cation cites A(1) and A(2) are occupied by elements A and B, respectively. One example of the crystal structure parameters of this oxide material is shown in Table 1 below.

TABLE 1

| Atomic Site | Structure Parameters | | |
|---|---|---|---|
| | | Position of Atom | |
| | | x | y | z |
| A(1) | 1a | 0 | 0 | 0 |
| A(2) | 1b | 0 | 0 | 0.5 |
| Cu | 2h | 0.5 | 0.5 | 0.25 |
| O | 4i | 0 | 0.5 | 0.25 |

In another aspect, the oxide material has a crystal structure which belongs to an orthorhombic system of Pmmm and I-47 and which has the following lattice parameters:

$$3.8\text{Å} \leq a \leq 3.95\text{Å}$$

$$3.82\text{Å} \leq b \leq 4.0\text{Å}$$

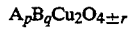

$$7.6\text{Å} \leq c \leq 8.0\text{Å}$$

the oxide material having an infinite layer structure composed of the following recurring unit:

CuO$_2$ plane—single layer cation site A(1)-CuO$_2$ plane—single layer cation site A(2), wherein the cation cites A(1) and A(2) are occupied by elements A and B, respectively. One example of the crystal structure parameters is given in Table 2 and the powder X-ray diffraction pattern thereof is shown in FIG. 3.

TABLE 2

| Atomic Site | Structure Parameters | | |
|---|---|---|---|
| | | Position of Atom | |
| | | x | y | z |
| A(1) | 1a | 0 | 0 | 0 |
| A(2) | 1c | 0 | 0 | 0.5 |
| Cu | 2t | 0.5 | 0.5 | 0.25 |
| O(1) | 2s | 0.5 | 0 | 0.25 |
| O(2) | 2r | 0 | 0.5 | 0.25 |

Table 3 below shows the critical temperatures and lattice parameters (length of a-axis) of known copper oxide superconductors. As will be seen by comparison of the results shown in Tables 4 and 5, shown in hereinafter, with those shown in Table 3, the lattice parameters of the oxides of the present invention match those of the known superconductors. Therefore, the oxide materials of the present invention may be suitably used as an insulating substrate for supporting thereon a thin superconducting film. By controlling the lattice parameter, the orientation of the film can be adjusted. Further, since the electrical properties of the oxide material can be varied at will from an insulator to a conductor, the oxide material can lend itself to a variety of utilizations.

TABLE 3

| Superconducting Oxide | Critical Temperature (K.) | Lattice Parameter (Å) |
| --- | --- | --- |
| $La_{1.85}Sr_{0.15}CuO_4$ | 37.5 | 3.7793 |
| $Nd_{1.4}Ce_{0.2}Sr_{0.4}CuO_4$ | 28 | 3.8563 |
| $Nd_{1.85}Ce_{0.15}CuO_4$ | 24 | 3.95 |
| $YBa_2Cu_3O_{6.91}$ | 91 | 3.8836 |
| $YBa_2Cu_4O_8$ | 80 | 3.869 |
| $Y_2Ba_4Cu_7O_{14}$ | 40 | 3.851 |
| $Pb_2Sr_2NdCu_3O_8$ | 70 | 3.853 |
| $TlBa_2CaCu_2O_7$ | 103 | 3.8566 |
| $TlBa_2Ca_2Cu_3O_9$ | 110 | 3.853 |
| $Tl_2Ba_2CuO_6$ | 70 | 3.868 |
| $Bi_2Sr_2CuO_6$ | 9 | 3.796 |
| $TlBa_2CaCu_2O_8$ | 99 | 3.8558 |
| $Bi_2Sr_2CaCu_2O$ | 90 | 3.829 |
| $Tl_2Ba_2Ca_2Cu_3O_{10}$ | 125 | 3.8503 |
| $TiBa_2Ca_2Cu_3O_9$ | 110 | 3.853 |

Moreover, the oxide material by itself shows superconductivity. Thus, in a further aspect, the present invention provides a superconducting oxide material having the following formula: $ABCu_2O_{4.4}$, wherein A and B are as defined above. This oxide has a crystal structure which belongs to a tetragonal system of P4/mmm and I-123 and which has the following lattice parameters:

$a = 3.93 Å$ $c = 7.77 Å$

The oxide material has an infinite layer structure composed of the following recurring unit:
 $CuO_2$ plane—one cation site A(1)-$CuO_2$ plane-one cation site A(2), wherein the cation cites A(1) and A(2) are occupied by elements A and B, respectively, and wherein the atomic sites of the infinite layer structure are as shown in Table 1.

It is, therefore, the prime object of the present invention to provide a novel, copper-containing oxide material having an infinite layer structure and suitable as a parent phase for forming a superconductor by carrier doping, as a substrate for forming a superconductor and as a superconductor.

BRIEF DESCRIPTION OF THE DRAWINGS

Other objects, features and advantages of the present invention will become apparent from the detailed description of the preferred embodiments of the present invention which follows, when considered in light of the accompanying drawings in which:

FIG. 1 is a schematic illustration showing the crystal structure of the oxide material according to the present invention;

FIG. 2 is a schematic illustration of the crystal structure of known oxide material having an infinite layer structure;

FIG. 3 is a simulated X-ray diffraction pattern determined on the basis of the crystal structure parameters obtained from the results of the crystal structure analysis using transmission electromicroscopy;

FIG. 9 is a graph showing temperature-specific resistivity characteristics of $BaSrCu_2O_{3.6}$ of the present invention obtained in Example 1;

FIG. 12 is a graph showing temperature-specific resistivity characteristics of $BaSrCu_2O_{4.2}$ of the present invention obtained in Example 2;

FIG. 14 is a graph showing temperature-specific resistivity characteristics of $BaSrCu_2O_{4.6}$ of the present invention obtained in Example 3;

DETAILED DESCRIPTION OF THE PREFERRED

Embodiments of the Invention

The following examples will further illustrate the present invention.

Example 1

Powders of $BaCO_3$, $SrCO_3$ and $CuO$ were blended with a molar ratio of 1:1:2 and ground in ethanol with a ball mill for 10 hours. The mixture was pellitized and calcined in an oxygen stream under various conditions as shown in Tables 4 and 5 involving a temperature of 900°–1,050° C. and a period of time of 10–30 hours. It is preferred that the calcined mass be repeatedly (about 2–4 times) subjected to a treatment involving pulverization, pelletization and calcination. The resulting calcined products were each encapsulated in a gold tube and subjected to a high pressure treatment to obtain oxide materials of the present invention and those which do not fall within the scope of the present invention. The treatments were performed at various conditions as shown in Tables 4 and 5 involving a temperature of 900°–1,200° C., a pressure of 4 GPa–6 GPa and a treatment time of 1–2 hours to obtain oxide samples Nos. 1–9. The crystallographic phase and lattice parameters of these products are shown in Tables 4 and 5. The above procedures were repeated in the same manner as described except that the combination of $BaCO_3$ and $SrCO_3$ was changed as shown in Tables 3 and 4 to obtain oxide samples Nos. 11–28. The conditions of the preparation and the results are shown in Tables 4 and 5. The oxide materials of the present invention show either a tetragonal system or an orthorhombic system depending upon the conditions under which they are prepared. The lattice parameters varies with the combination of cations A and B.

Figure 5:
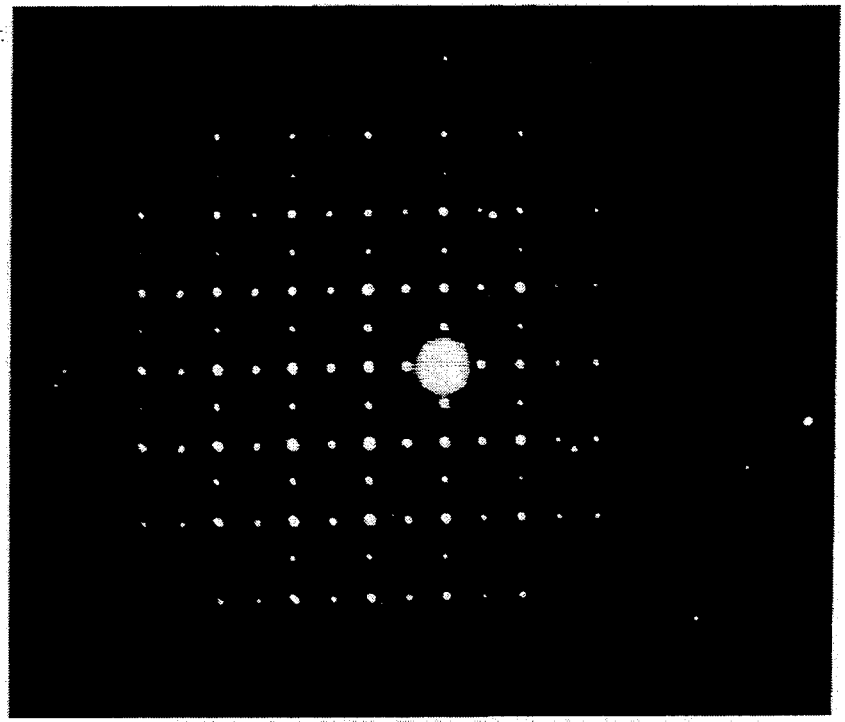
FIG. 5 is a photograph showing an electron diffraction pattern of $BaSrCu_2O_{3.6}$ taken with the incident electron beam along the c-axis.
Figure 7:
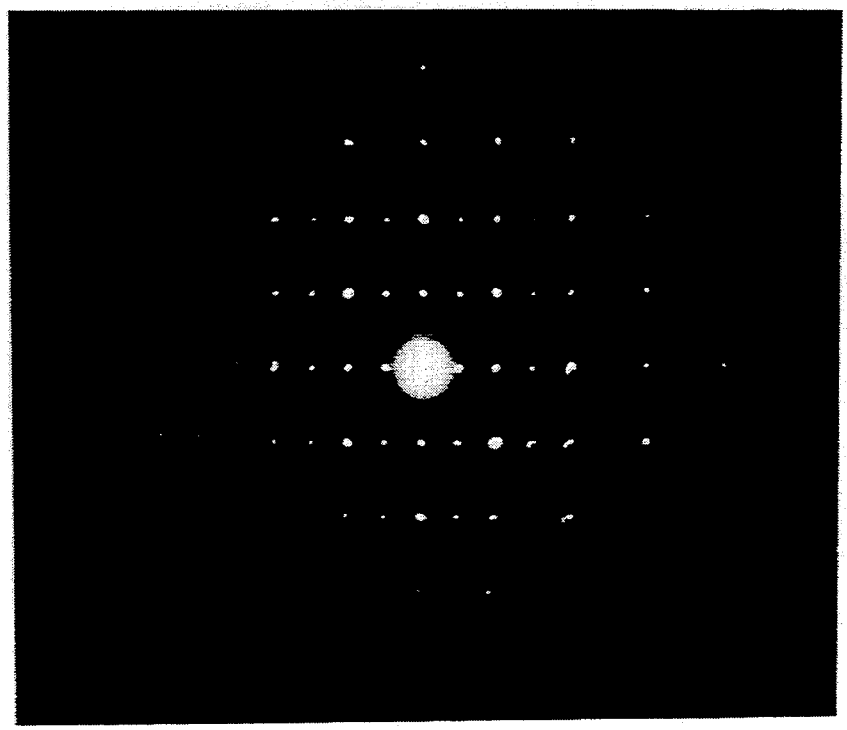
FIG. 7 is a photograph showing an electron diffraction pattern of $BaSrCu_2O_{3.6}$ taken with the incident electron beam along the b-axis.

(indicated by the arrow) attributed to a superstructure of $3\sqrt{2}a \times 3\sqrt{2}b$ are observed. In FIG. 7, tint spots of the superstructure of $2\sqrt{2}a \times 2\sqrt{2}b$ as seen in FIG. 5 are seen along the a-axis.

Figure 8:
FIG. 8 is a high resolution electronmicrograph showing the crystal lattice of $BaSrCu_2O_{3.6}$ in the a-c cross-section.

From the results of the electron diffraction patterns, Sample No. 1 is found to have a crystal structure belonging to an orthorhombic system having lattice parameters of a=3.92, b=3.94 and c=7.93. FIG. 8 shows a high resolution electron micrograph of the same sample, with the incident electron beam being perpendicular to the c-axis. From the variation of contrast, it will be appreciated that there exists an ordering along the c-axis in every two unit cells. The period is 7.93 Å. Also found is that the crystal has a two-layered structure in the c-axis. From the results of the electron microscopy, the structure parameters as shown in Table 2 may be determined. FIG. 3 is a simulated X-ray diffraction pattern calculated on the basis of the structure parameters. It is seen that the simulated fiffraction pattern coin-

TABLE 4

| Sample No. | Raw Material Powder | | Calcination | | High Pressure Treatment | | | Crystallographic Phase | Lattice Parameter of $ABCu_2O_4$ Phase (Å) | | |
|---|---|---|---|---|---|---|---|---|---|---|---|
| | A | B | Temp. (°C.) | Time (Hr) | Temp. (°C.) | Press. (GPa) | Time | | a | b | c |
| 1* | $BaCO_3$ | $SrCO_3$ | 900 | 20 | 1,200 | 6 | 2 | $BaSrCu_2O_{3.6}$ | 3.92 | 3.94 | 7.93 |
| 2* | $BaCO_3$ | $SrCO_3$ | 1000 | 20 | 1,100 | 4 | 2 | $BaSrCu_2O_{3.7}$ | 3.92 | 3.94 | 7.93 |
| 3* | $BaCO_3$ | $SrCO_3$ | 1000 | 10 | 1,000 | 6 | 1 | $BaSrCu_2O_{3.8}$ | 3.92 | 3.94 | 7.93 |
| 4* | $BaCO_3$ | $SrCO_3$ | 950 | 20 | 1,000 | 4 | 1 | $BaSrCu_2O_{3.8}$ | 3.92 | 3.94 | 7.93 |
| 5* | $BaCO_3$ | $SrCO_3$ | 900 | 30 | 1,100 | 6 | 1 | $BaSrCu_2O_{3.7}$ | 3.92 | 3.94 | 7.93 |
| 6 | $BaCO_3$ | $SrCO_3$ | 900 | 20 | 900 | 6 | 1 | $BaSrCu_2O_x$, $SrCO_3$ | | | |
| 7 | $BaCO_3$ | $SrCO_3$ | 950 | 15 | 950 | 6 | 1 | $BaSrCu_2O_x$, $SrCO_3$ | | | |
| 8 | $BaCO_3$ | $SrCO_3$ | 1000 | 15 | 950 | 6 | 1 | $BaSrCu_2O_x$, $SrO_2$ | | | |
| 9 | $BaCO_3$ | $SrCO_3$ | 1050 | 10 | 1,000 | 4 | 1 | $BaCuO_2$, $SrCuO_2$ | | | |
| 10 | $BaCO_3$ | $CaCO_3$ | 950 | 10 | 1,200 | 6 | 2 | $BaCuO_2$, $Ca_2CuO_3$ | | | |
| 11 | $BaCO_3$ | $CaCO_3$ | 950 | 30 | 1,000 | 4 | 2 | $BaCuO_2$, $Ca_2CuO_3$ | | | |
| 12 | $BaCO_3$ | $CaCO_3$ | 1000 | 30 | 1,200 | 6 | 1 | $BaCuO_2$, $Ca_2CuO_3$ | | | |
| 13 | $SrCO_3$ | $CaCO_3$ | 950 | 30 | 1,200 | 4 | 2 | $(Sr, Ca)CuO_2$ | | | |
| 14 | $SrCO_3$ | $CaCO_3$ | 900 | 20 | 1,000 | 4 | 1 | $(Sr, Ca)CuO_2$ | | | |
| 15 | $BaCO_3$ | $MgCO_3$ | 1020 | 20 | 1,100 | 4 | 1 | $BaCuO_2$, MgO | | | |

*: Oxide material of the present invention

TABLE 5

| Sample No. | Raw Material Powder | | Calcination | | High Pressure Treatment | | | Crystallographic Phase | Lattice Parameter of $ABCu_2O_4$ Phase (Å) | | |
|---|---|---|---|---|---|---|---|---|---|---|---|
| | A | B | Temp. (°C.) | Time (Hr) | Temp. (°C.) | Press. (GPa) | Time | | a | b | c |
| 16 | $SrCO_3$ | $MgCO_3$ | 1000 | 10 | 1,000 | 6 | 2 | $SrCuO_2$, MgO | | | |
| 17 | $CaCO_3$ | $MgCO_3$ | 1050 | 20 | 1,000 | 4 | 2 | $Ca_2CuO_3$, MgO | | | |
| 18 | $BaCO_3$ | $La_2O_3$ | 950 | 30 | 1,050 | 4 | 2 | $(La, Ba)CuO_{3-x}$ | | | |
| 19 | $La_2O_3$ | $SrCO_3$ | 950 | 20 | 1,000 | 4 | 1 | $(La, Sr)CuO_2$ | | | |
| 20 | $La_2O_3$ | $CaCO_3$ | 1000 | 30 | 1,100 | 4 | 1 | $LaCuO_3$, CaO | | | |
| 21* | $BaCO_3$ | $Nd_2O_3$ | 900 | 30 | 1,200 | 6 | 2 | $BaNdCu_2O_{3.7}$ | 3.95 | 3.95 | 8.00 |
| 22 | $SrCO_3$ | $Nd_2O_3$ | 1000 | 20 | 1,150 | 6 | 1 | $(Nd, Sr)CuO_2$ | | | |
| 23 | $CaCO_3$ | $Eu_2O_3$ | 1000 | 30 | 1,100 | 6 | 1 | $Nd_2CuO_4$, CaO | | | |
| 24* | $BaCO_3$ | $Eu_2O_3$ | 1050 | 10 | 1,000 | 4 | 1 | $BaEuCu_2O_{3.9}$ | 3.82 | 3.82 | 7.83 |
| 25* | $SrCO_3$ | $Eu_2O_3$ | 950 | 10 | 1,200 | 6 | 1 | $SrEuCu_2O_{3.9}$ | 3.80 | 3.80 | 7.80 |
| 26 | $CaCO_3$ | $K_2CO_3$ | 950 | 30 | 1,000 | 4 | 2 | $EuCuO_4$, CaO | | | |
| 27 | $BaCO_3$ | $Na_2CO_3$ | 1000 | 30 | 1,200 | 6 | 1 | $BaCuO_2$, $KCuO_2$ | | | |
| 28 | $SrCO_3$ | $CaCO_3$ | 950 | 30 | 1,200 | 4 | 2 | $SrCuO_2$, $NaCuO_2$ | | | |

*: Oxide material of the present invention

Figure 4:
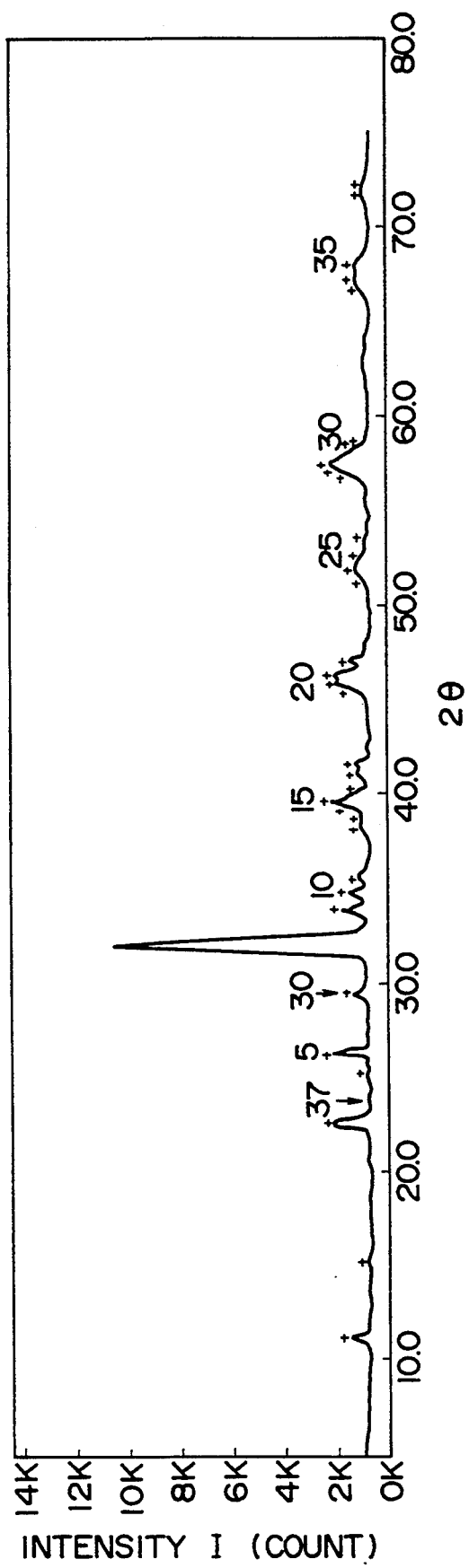
FIG. 4 is an X-ray diffraction pattern of $BaSrCu_2O_{3.6}$ obtained in Example 1.
Figure 6:
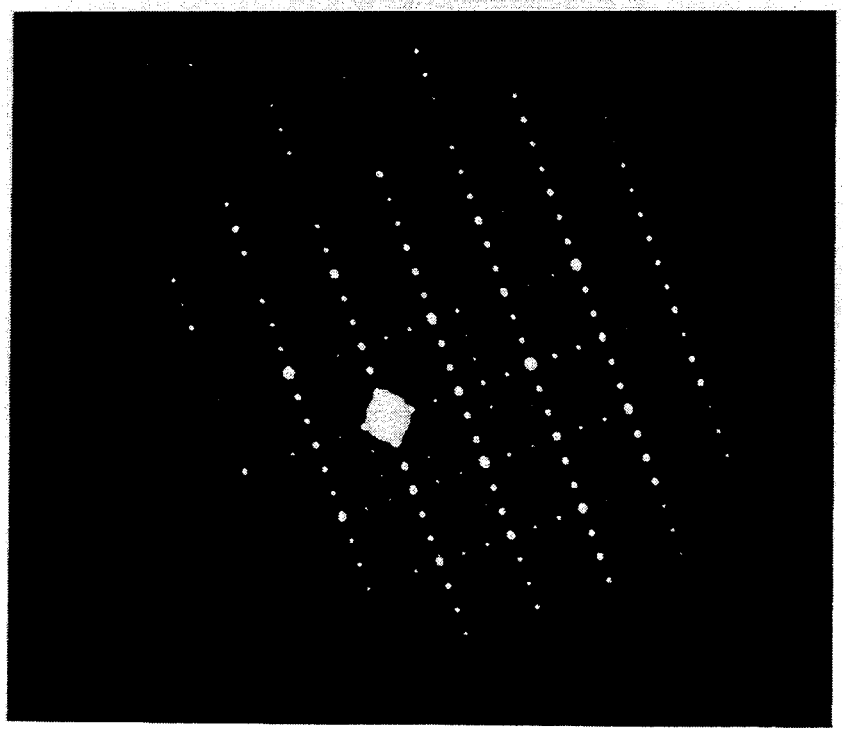
FIG. 6 is a photograph showing an electron diffraction pattern of $BaSrCu_2O_{3.6}$ taken with the incident electron beam along the a-axis.

The X-ray diffraction pattern of Sample No. 1 (BaSrCu$_2$O$_{3.6}$) is shown in FIG. 4. The crystallographic phase of this sample was observed with a transmission electron microscope and photographs of the electron diffraction patterns were taken. FIG. 5 is a photograph of the electron diffraction pattern of Sample No. 1 with the incident beam along the c-axis. Spots as indicated by the arrow are due to the superstructure of $2\sqrt{2}a \times 2\sqrt{2}b$. FIGS. 6 and 7 are similar photographs of the electron diffraction pattern with the incident beam along the a- and b-axes, respectively. In FIG. 6, spots cides with the measured one shown in FIG. 4, indicating that the simulation is correct.

Figure 10:
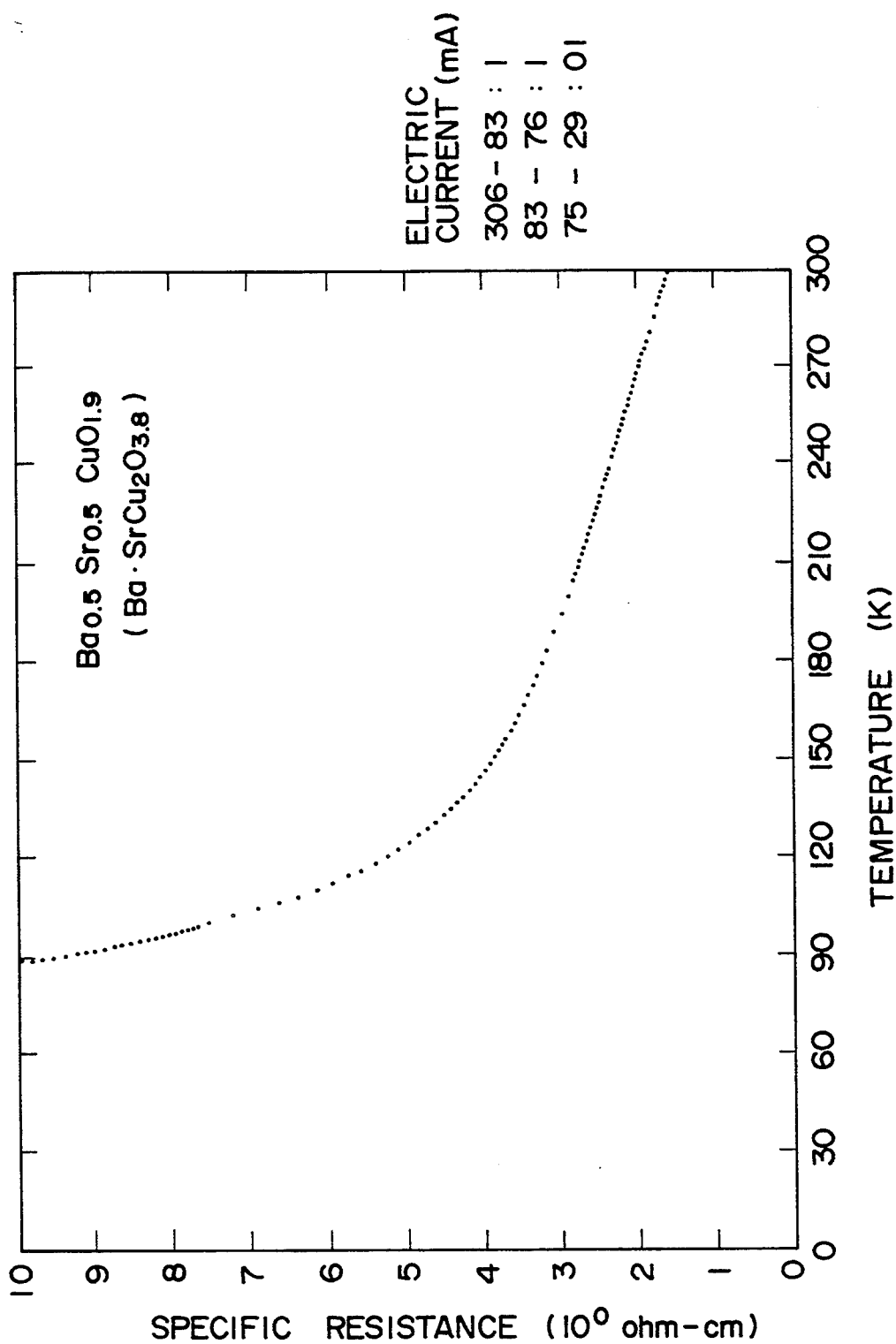
FIG. 10 is a graph showing temperature-specific resistivity characteristics of $BaSrCu_2O_{3.8}$ of the present invention obtained in Example 1.
Figure 11:
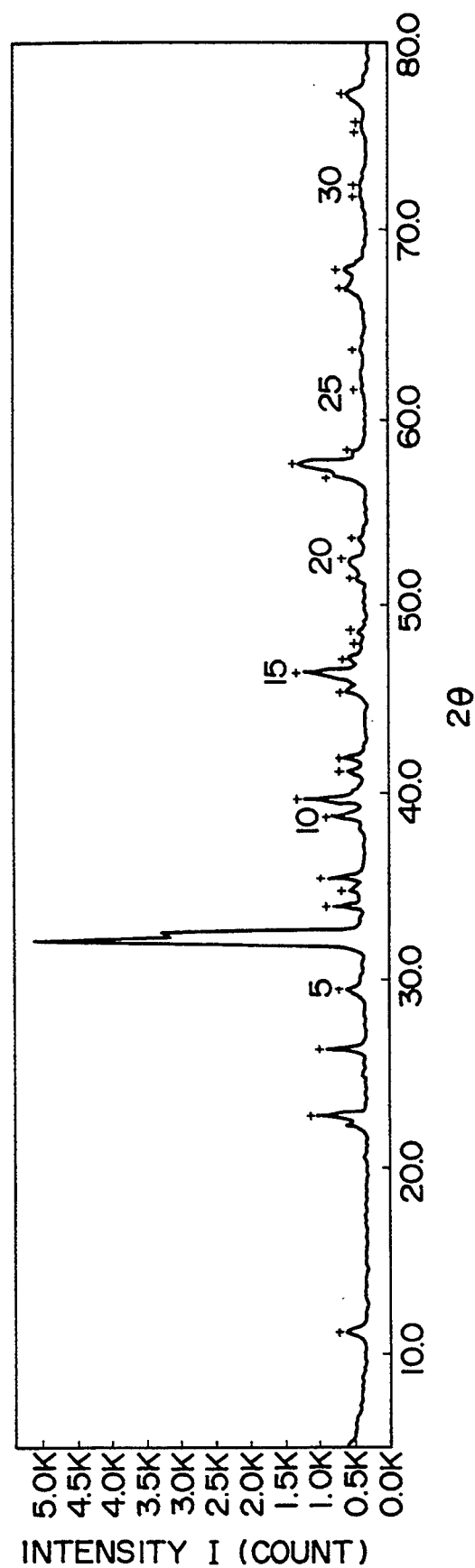
FIG. 11 is a powder X-ray diffraction pattern of $BaSrCu_2O_{4.2}$ of the present invention obtained in Example 2.

Temperature dependence of the specific resistance of Sample No. 1 is shown in FIG. 9, from which it is seen that this oxide material shows metallic behavior with respect to resistance. This electrical characteristics of this material can be changed between an insulator and a metal. FIG. 10 shows temperature-specific resistivity characteristics of Sample No. 3 (BaSrCu$_2$O$_{3.8}$). This oxide material shows a behavior like a semiconductor with respect to the resistivity. From the results shown in FIGS. 9 and 10, it will be appreciated that the characteristics of the oxide material of this invention can be changed by changing the content of oxygen (the value of r) according to the intended use.

specific resistance of Sample No. 33 is shown in FIG. 12.

Figure 22:
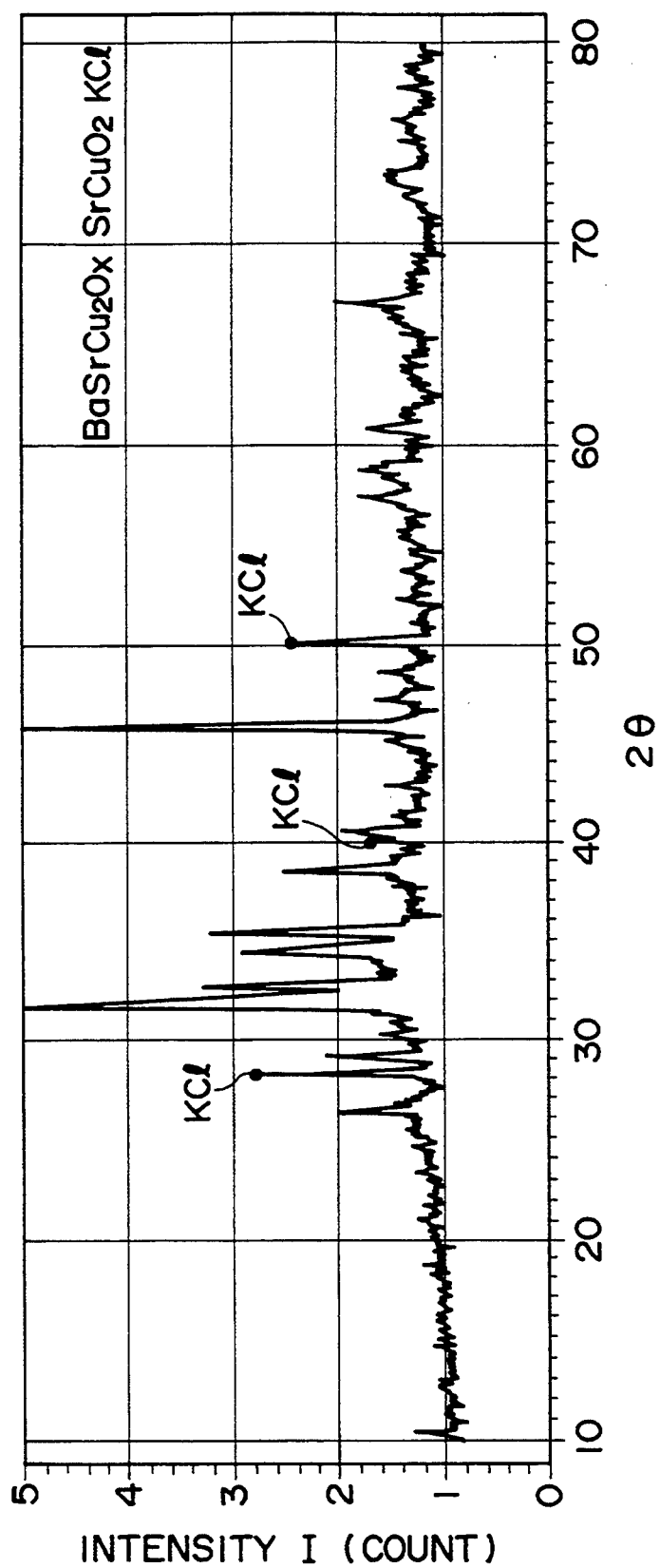
Figure 24:
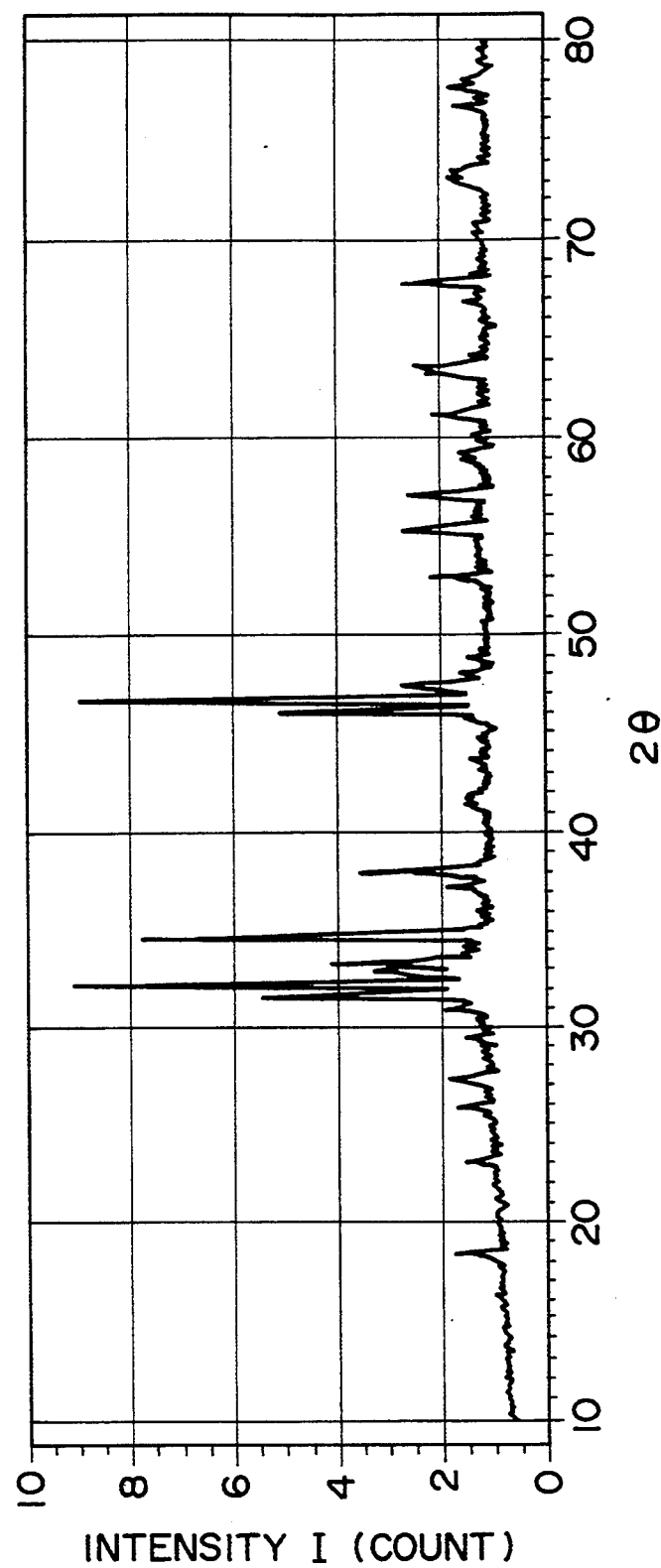

FIGS. 22 and 24 show X-ray diffraction patterns of Sample Nos. 36 and 37 (comparative samples), respectively.

TABLE 6

| Sample No. | Raw Material Powder A | B | Calcination Temp. (°C.) | Time (Hr) | Amount of KClO$_4$ (wt %) | High Pressure Treatment Temp. (°C.) | Press. (GPa) | Time | Crystallographic Phase | Lattice Parameter of ABCu$_2$O$_4$ Phase (Å) a | b | c |
|---|---|---|---|---|---|---|---|---|---|---|---|---|
| 29* | BaCO$_3$ | SrCO$_3$ | 900 | 30 | 0.1 | 1,200 | 6 | 2 | BaSrCu$_2$O$_{3.8}$ | 3.92 | 3.94 | 7.93 |
| 30* | BaCO$_3$ | SrCO$_3$ | 950 | 20 | 0.5 | 1,100 | 6 | 2 | BaSrCu$_2$O$_{4.0}$ | 3.92 | 3.94 | 7.93 |
| 31* | BaCO$_3$ | SrCO$_3$ | 920 | 10 | 0.5 | 1,000 | 6 | 1 | BaSrCu$_2$O$_{4.4}$ | 3.92 | 3.94 | 7.93 |
| 32* | BaCO$_3$ | SrCO$_3$ | 950 | 20 | 0.1 | 1,000 | 4 | 2 | BaSrCu$_2$O$_{3.9}$ | 3.92 | 3.94 | 7.93 |
| 33* | BaCO$_3$ | SrCO$_3$ | 1000 | 10 | 0.3 | 1,100 | 6 | 1 | BaSrCu$_2$O$_{4.2}$ | 3.92 | 3.94 | 7.93 |
| 34 | BaCO$_3$ | SrCO$_3$ | 900 | 30 | 0.05 | 900 | 6 | 1 | BaSrCu$_2$O$_{3.4}$ | | | |
| 35 | BaCO$_3$ | SrCO$_3$ | 950 | 15 | 0.25 | 950 | 6 | 1 | BaSrCu$_2$O$_x$, SrCuO$_2$ | | | |
| 36 | BaCO$_3$ | SrCO$_3$ | 870 | 15 | 0.6 | 950 | 6 | 1 | BaSrCu$_2$O$_x$, SrO$_2$ | | | |
| 37 | BaCO$_3$ | SrCO$_3$ | 920 | 10 | 0.4 | 1,000 | 4 | 1 | BaCuO$_2$, SrO$_2$ | | | |

Figure 20:
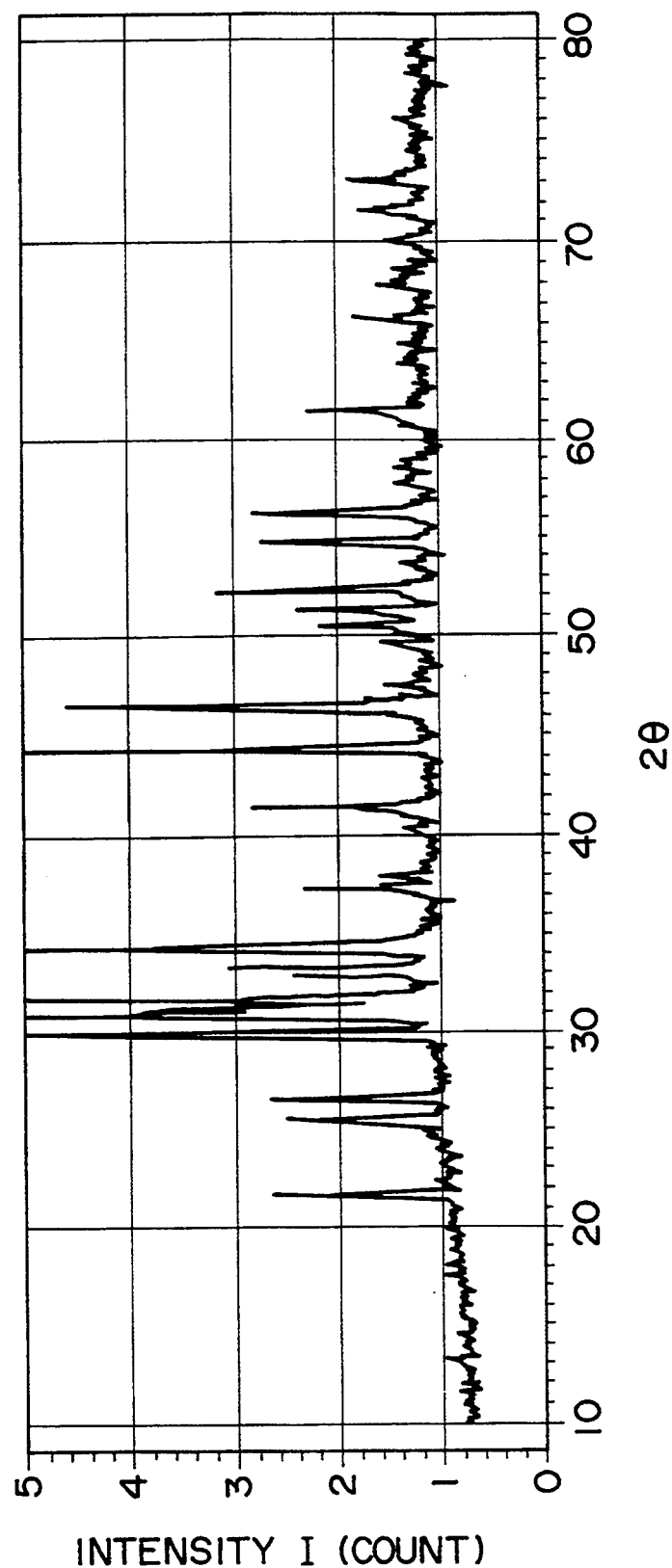
FIGS. 20-25 are powder X-ray diffraction patterns of comparative oxide materials obtained in Examples 1-5.
Figure 21:
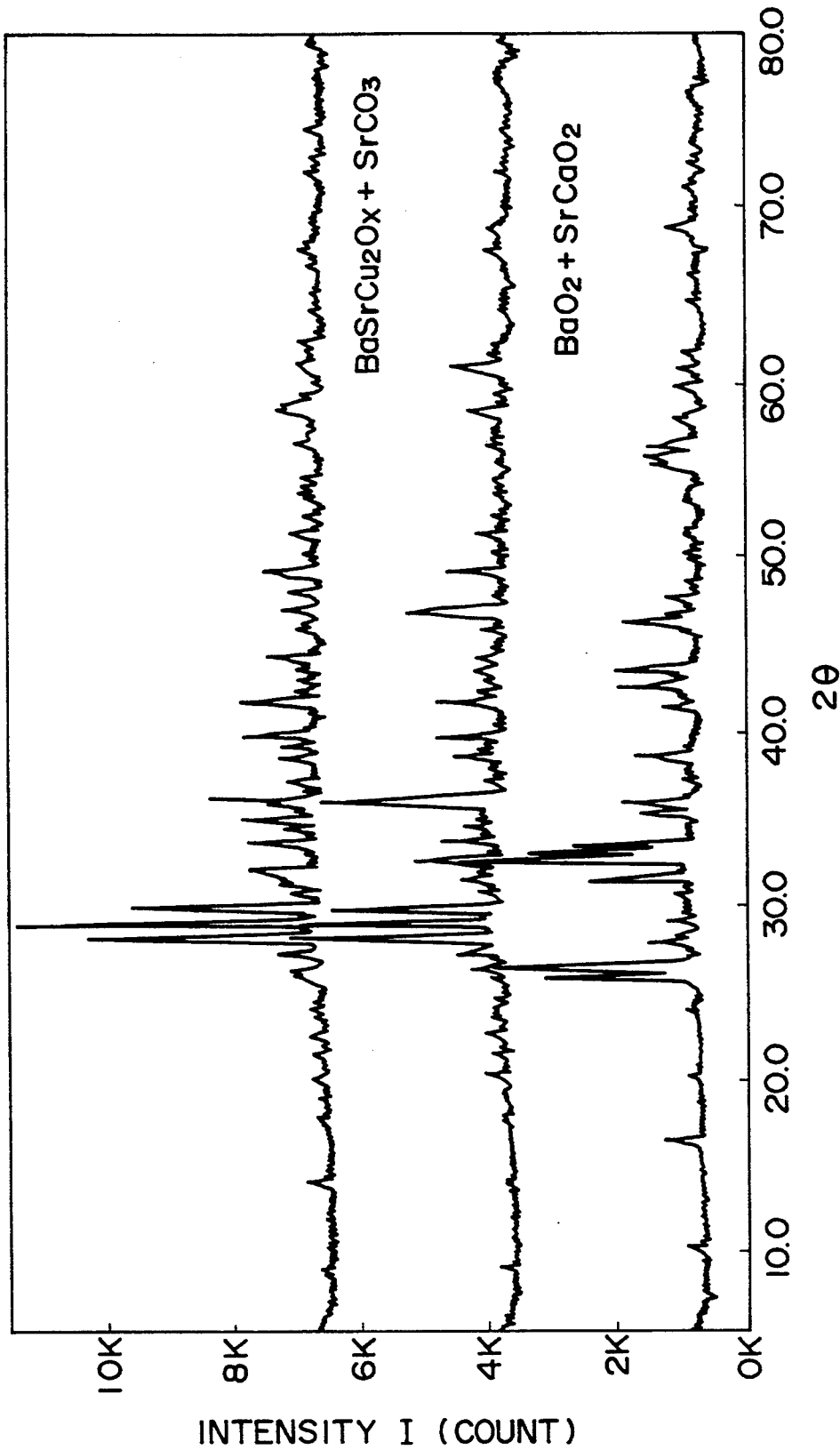
Figure 23:
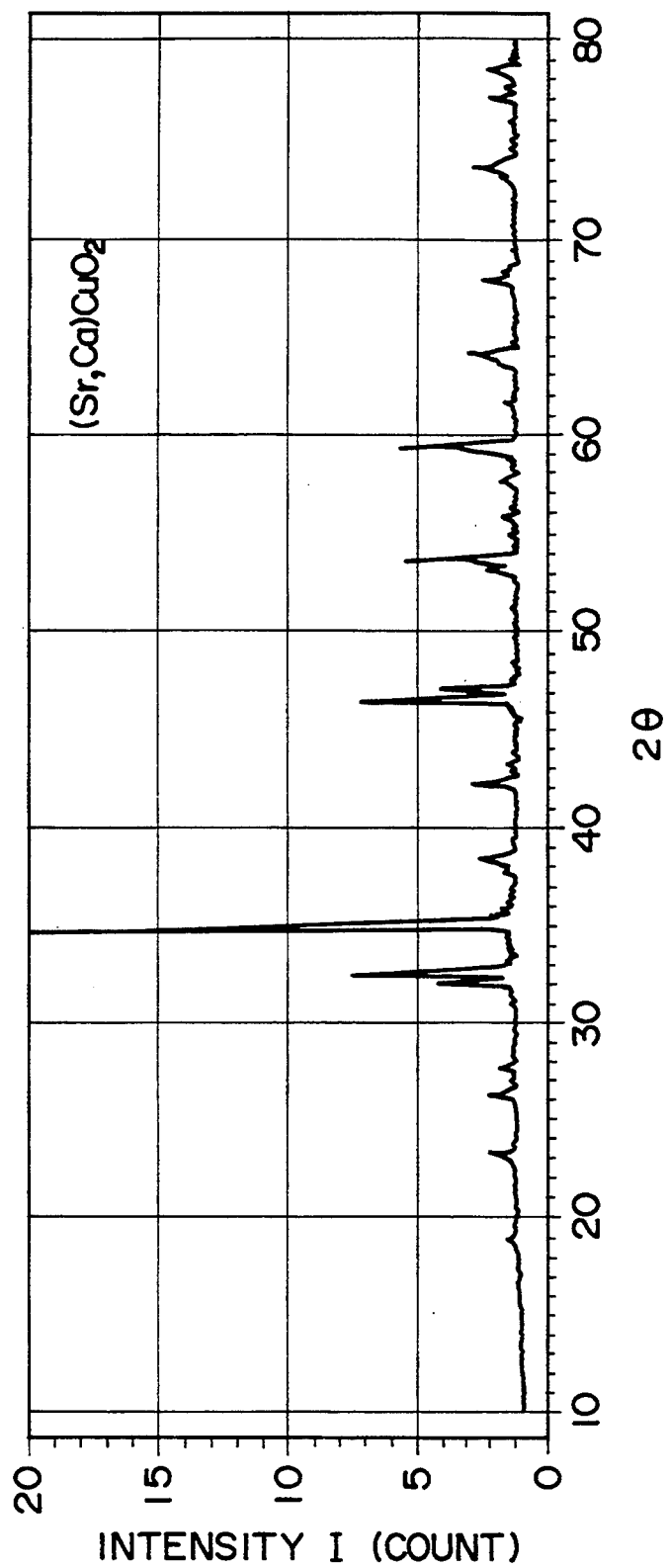

FIGS. 20, 21 and 23 show X-ray diffraction patterns of Sample Nos. 28, 7 and 13 (comparative samples), respectively.

Example 2

Powders of BaCO$_3$, SrCO$_3$ and CuO were blended with a molar ratio of 1:1:2 and ground in ethanol with a ball mill for 10 hours. The mixture was pellitized and calcined in an oxygen stream under various conditions as shown in Table 6 and involving a temperature of 900°-1,000° C. and a period of time of 10-30 hours. It is preferred that the calcined mass be repeatedly (about 2-4 times) subjected to a treatment involving pulverization, pelletization and calcination. The resulting calcined products were each admixed with KClO$_4$ (oxydizing agent) in an amount shown in Table 6. The admixture was encapsulated in a gold tube and subjected to a high pressure treatment to obtain oxide materials of the present invention and those which do not fall within the scope of the present invention. The treatments were performed at various conditions as shown in Table 6 and involving a temperature of 900°-1,200° C., a pressure of 4 GPa-6 GPa and a treatment time of 1-2 hours to obtain oxide samples Nos. 29-37. The crystallographic phase and lattice parameters of these products are shown in Table 6.

The X-ray diffraction pattern of Sample No. 33 (BaSrCu$_2$O$_{4.2}$) is shown in FIG. 4. The crystallographic phase of this sample was observed with a transmission electron microscope and the electron diffraction patterns were observed. Sample No. 33 is found to have a crystal structure belonging to an orthorhombic system having lattice parameters of a=3.92, b=3.94 and c=7.93. Also found is that the crystal has a two-layered structure in the c-axis. Temperature dependence of the Example 3

Powders of BaCO$_3$, SrCO$_3$ and CuO were blended with a molar ratio of 1:1:2 and ground in ethanol with a ball mill for 10 hours. The mixture was pellitized and calcined in an oxygen stream under various conditions as shown in Table 7 and involving a temperature of 900°-1,000° C. and a period of time of 10-30 hours. The resulting calcined products were each admixed with KClO$_4$ (oxydizing agent) in an amount shown in Table 7. The admixture was encapsulated in a gold tube and subjected to a high pressure treatment to obtain oxide materials of the present invention and those which do not fall within the scope of the present invention. The treatments were performed at various conditions as shown in Table 7 and involving a temperature of 1,000°-1,200° C., a pressure of 4 GPa-6 GPa and a treatment time of 1-2 hours to obtain oxide samples Nos. 38-43. The crystallographic phase and lattice parameters of these products are shown in Table 7.

Figure 13:
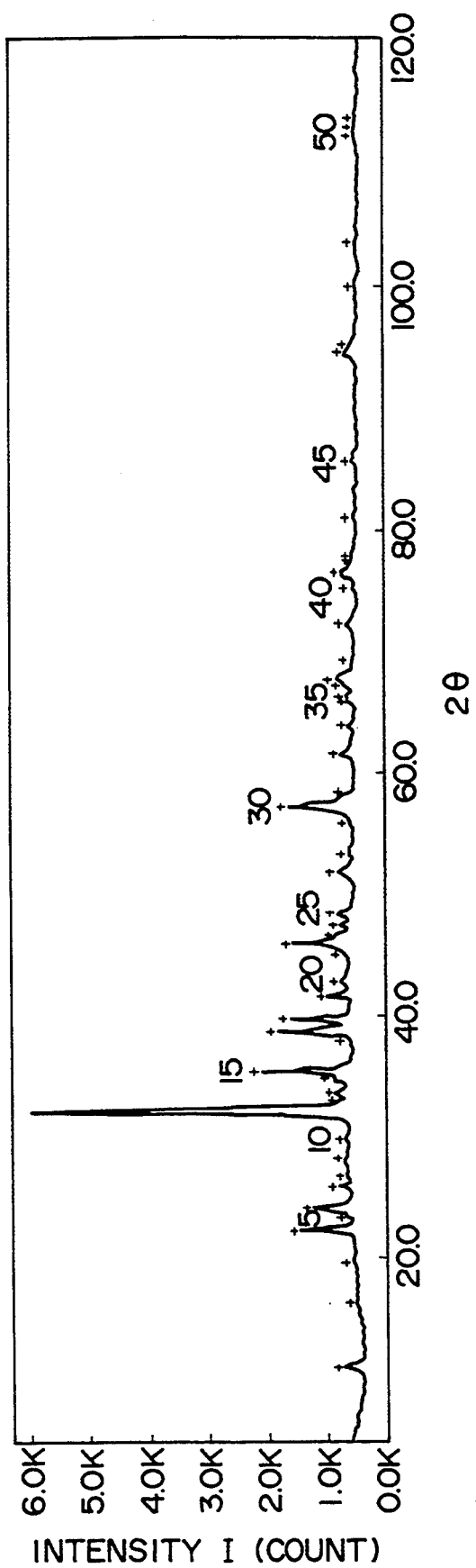
FIG. 13 is a powder X-ray diffraction pattern of $BaSrCu_2O_{4.6}$ of the present invention obtained in Example 3.

The X-ray diffraction pattern of Sample No. 40 (BaSrCu$_2$O$_{4.6}$) is shown in FIG. 13. The crystallographic phase of this sample was observed with a transmission electron microscope and the electron diffraction patterns were observed. Sample No. 40 is found to have a crystal structure belonging to a tetragonal system having lattice parameters of a=3.93 and c=7.77. Also found is that the crystal has a two-layered structure in the c-axis. Temperature dependence of the specific resistance of Sample No. 40 is shown in FIG. 14. Samples Nos. 39 and 40 showed Tc of 10K.

Figure 15:
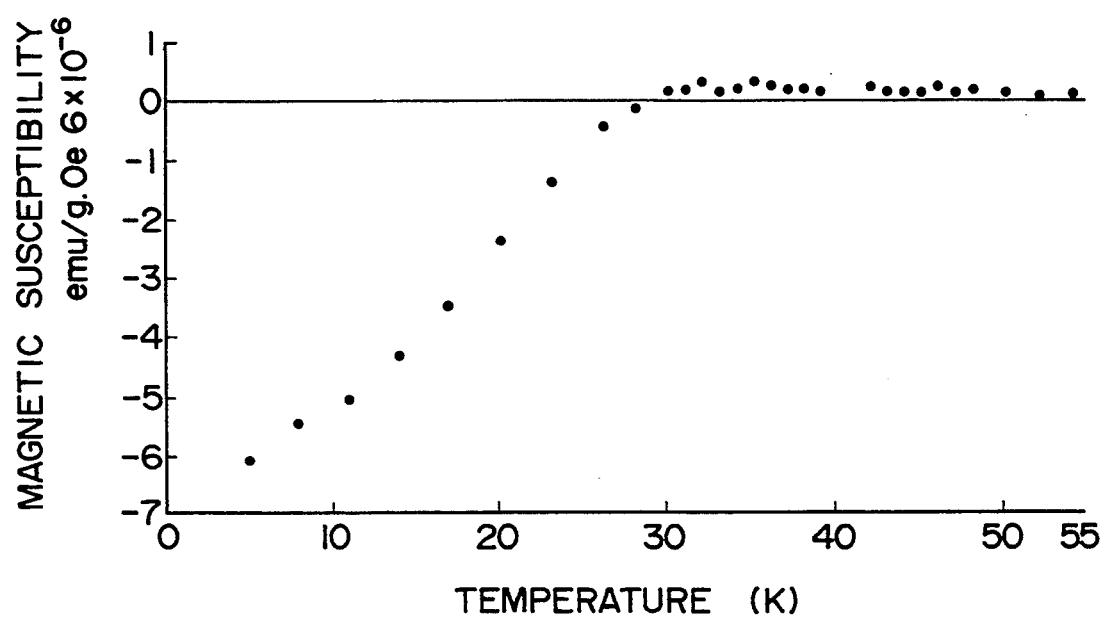
FIG. 15 is a graph showing temperature-magnetic susceptibility characteristics of $BaSrCu_2O_{4.4}$ of the present invention obtained in Example 3.

FIG. 15 is a graph showing the relationship between temperature and magnetic susceptibility of the oxide sample No. 38 (BaSrCu$_2$O$_{4.4}$). This sample have Tc$^{ON}$ of 40K and Tc$^{zero}$ of 20K and shows superconductivity.

FIG. 22 shows an X-ray diffraction pattern of Sample No. 41 (comparative sample).

TABLE 7

| Sample No. | Raw Material Powder A | B | Calcination Temp. (°C.) | Time (Hr) | Amount of KClO$_4$ (wt %) | High Pressure Treatment Temp. (°C.) | Press. (GPa) | Time | Crystallographic Phase | Lattice Parameter of ABCu$_2$O$_4$ Phase (Å) a | b | c |
|---|---|---|---|---|---|---|---|---|---|---|---|---|
| 38* | BaCO$_3$ | SrCO$_3$ | 900 | 30 | 0.8 | 1,200 | 6 | 2 | BaSrCu$_2$O$_{4.4}$ | 3.93 | 3.93 | 7.77 |
| 39* | BaCO$_3$ | SrCO$_3$ | 950 | 20 | 1.5 | 1,100 | 4 | 2 | BaSrCu$_2$O$_{4.6}$ | 3.93 | 3.93 | 7.77 |
| 40* | BaCO$_3$ | SrCO$_3$ | 1020 | 10 | 2.0 | 1,000 | 6 | 1 | BaSrCu$_2$O$_{4.6}$ | 3.93 | 3.93 | 7.77 |
| 41 | BaCO$_3$ | SrCO$_3$ | 950 | 20 | 2.5 | 1,000 | 4 | 1 | BaSrCu$_2$O$_x$, SrO$_2$ | | | |
| 42 | BaCO$_3$ | SrCO$_3$ | 900 | 30 | 3.0 | 1,100 | 6 | 1 | BaSrCu$_2$O$_x$, SrO$_2$ | | | |

TABLE 7-continued

| Sample No. | Raw Material Powder A | B | Calcination Temp. (°C.) | Time (Hr) | Amount of KClO4 (wt %) | High Pressure Treatment Temp. (°C.) | Press. (GPa) | Time | Crystallographic Phase | Lattice Parameter of ABCu2O4 Phase (Å) a | b | c |
|---|---|---|---|---|---|---|---|---|---|---|---|---|
| 43 | BaCO3 | SrCO3 | 900 | 20 | 0.7 | 1,200 | 6 | 2 | BaSrCu2O4.1 | 3.92 | 3.94 | 7.80 |

Example 4

Powders of BaO (or BaO2), SrO2 (or SrO) and CuO were blended with a molar ratio of 1:1:2 and pulverized in a mortar in an inert gas atmsophere. The mixture was encapsulated in a gold tube and subjected to a high pressure treatment to obtain oxide materials of the present invention and those which do not fall within the scope of the present invention. The treatments were performed at various conditions as shown in Table 8 and involving a temperature of 1,000°–1,200° C., a pressure of 4 GPa–6 GPa and a treatment time of 1–2 hours to obtain oxide samples Nos. 44–50. The crystallographic phase and lattice parameters of these products are shown in Table 8.

Figure 16:
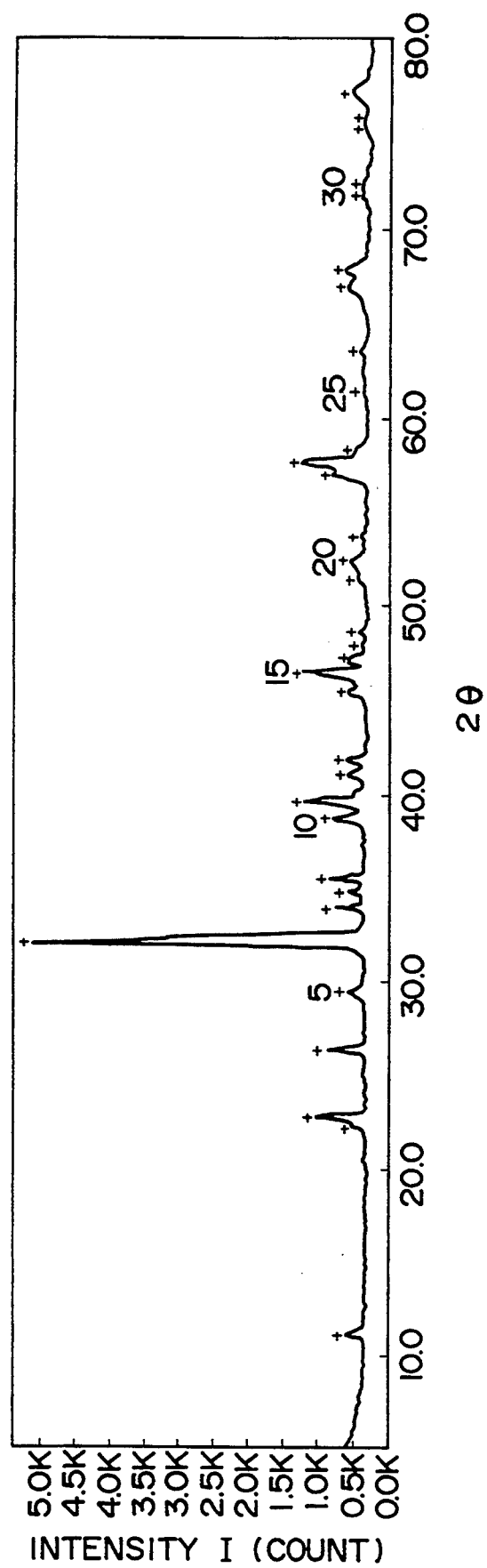
FIG. 16 is a powder X-ray diffraction pattern of $BaSrCu_2O_{3.9}$ of the present invention obtained in Example 4.
Figure 17:
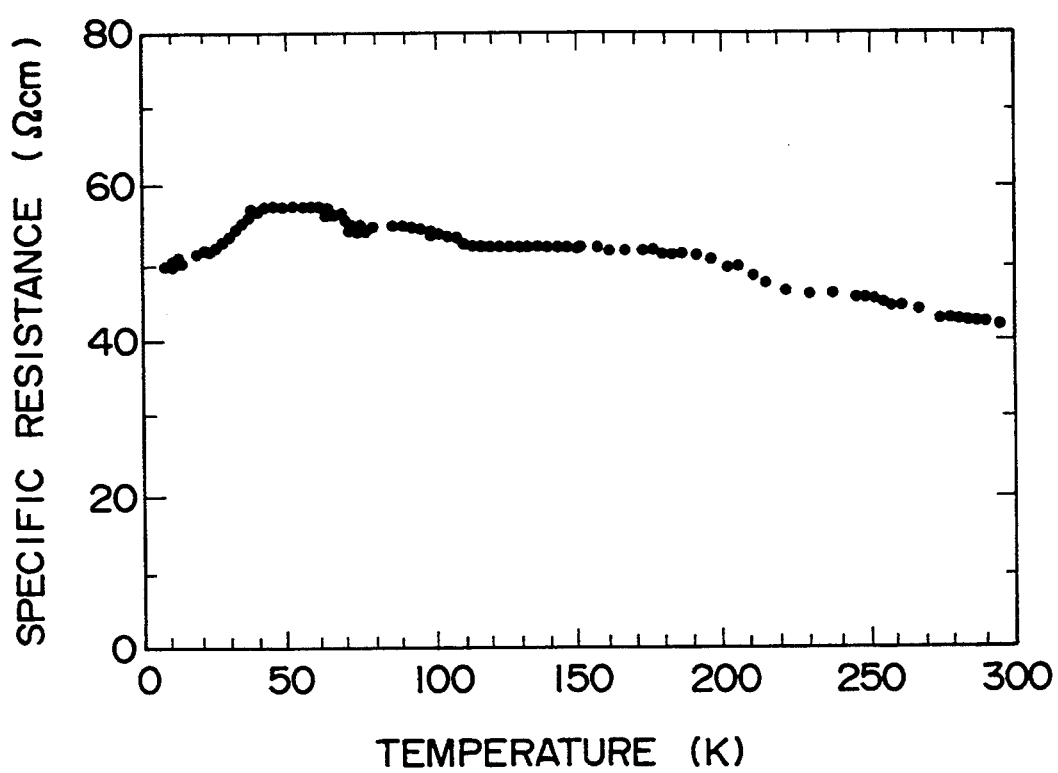
FIG. 17 is a graph showing temperature-specific resistivity characteristics of $BaSrCu_2O_{3.9}$ of the present invention obtained in Example 4.

The X-ray diffraction pattern of Sample No. 46 (BaSrCu2O3.9) is shown in FIG. 16. The crystallographic phase of this sample was observed with a transmission electron microscope and the electron diffraction patterns were observed. Sample No. 46 is found to have a crystal structure belonging to an orthorhombic system having lattice parameters of a=3.92, b=3.94 and c=7.93. Also found is that the crystal has a two-layered structure in the c-axis. Temperature dependence of the specific resistance of Sample No. 46 is shown in FIG. 17.

Figure 25:
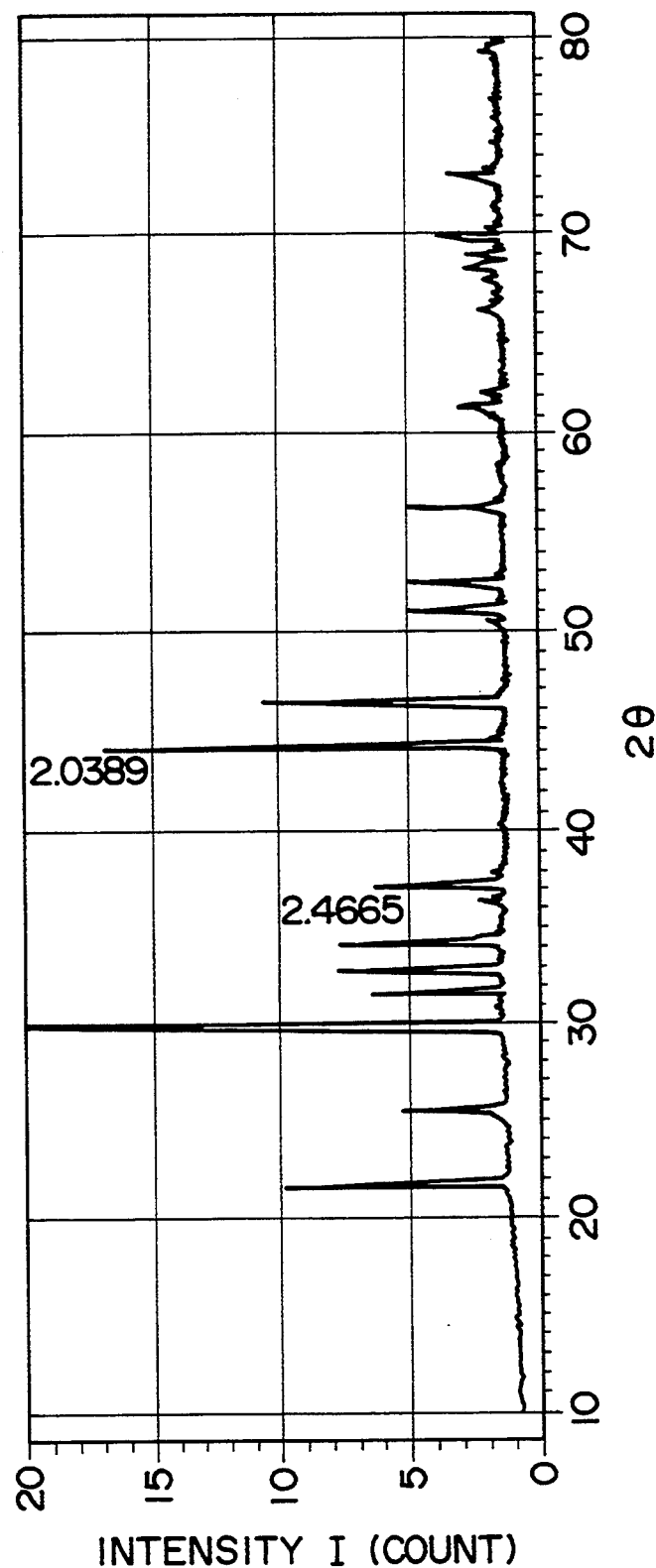

FIG. 25 shows an X-ray diffraction pattern of Sample No. 48 (comparative sample).

uct was encapsulated in a gold tube and subjected to a high pressure treatment to obtain oxide materials of the present invention and those which do not fall within the scope of the present invention. The treatments were performed at various conditions as shown in Table 9 and involving a temperature of 900°–1,200° C., a pressure of 4 GPa–6 GPa and a treatment time of 1–2 hours to obtain oxide samples Nos. 51–56. The crystallographic phase and lattice parameters of these products are shown in Table 9.

Figure 18:
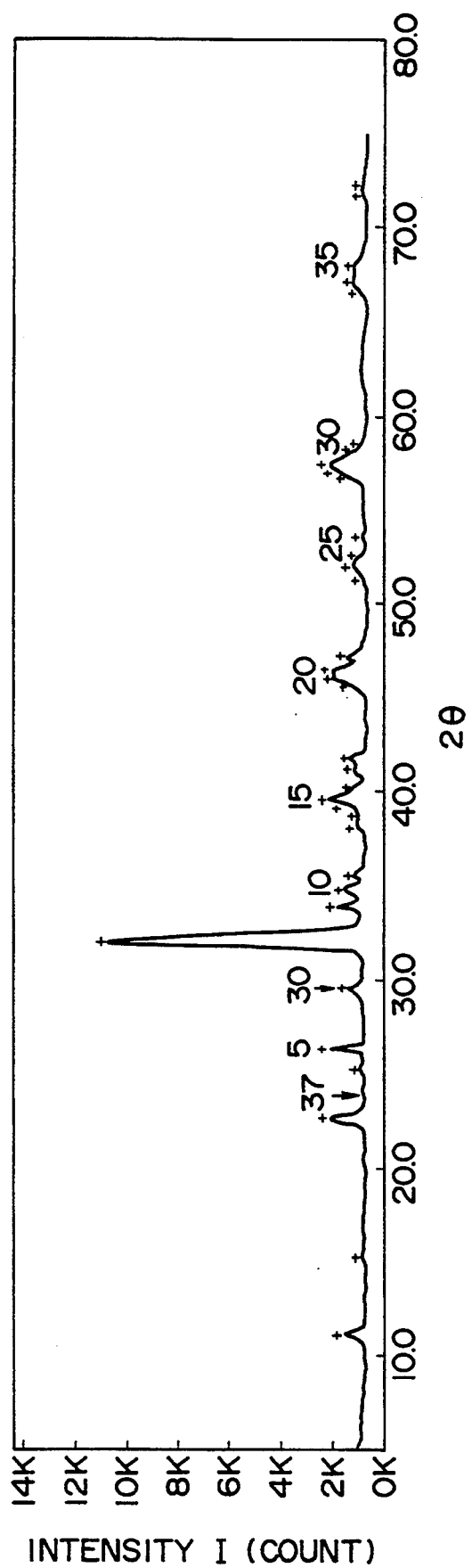
FIG. 18 is a powder X-ray diffraction pattern of $BaSrCu_2O_{3.7}$ of the present invention obtained in Example 5.
Figure 19:
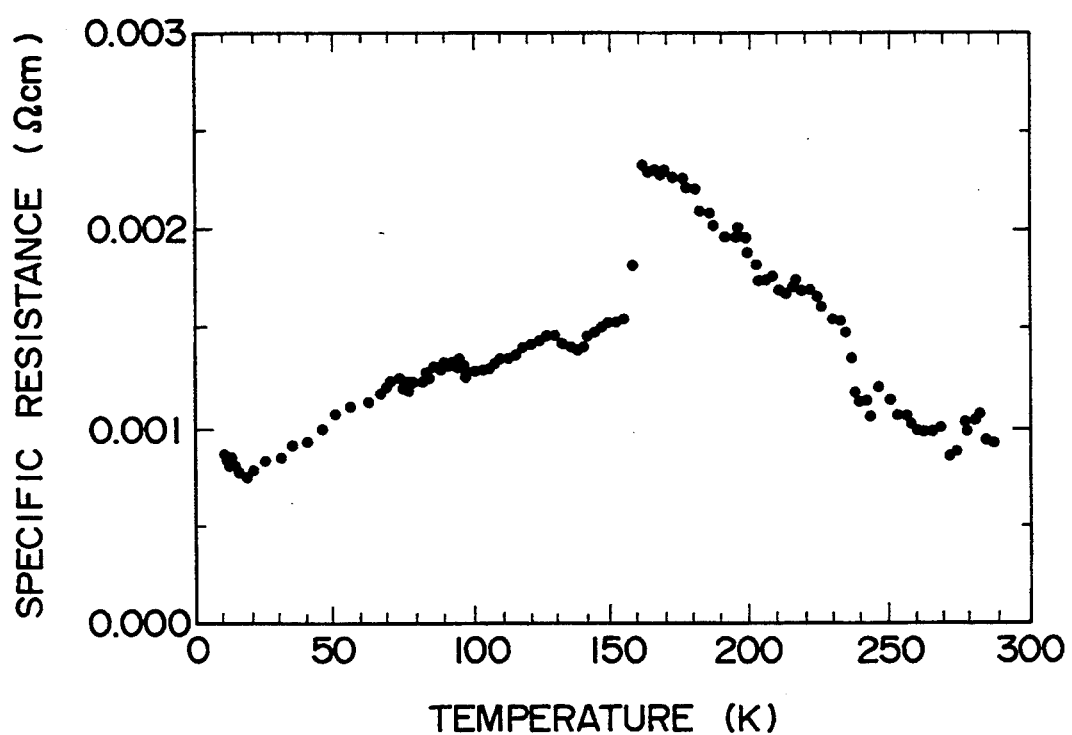
FIG. 19 is a graph showing temperature-specific resistivity characteristics of $BaSrCu_2O_{3.7}$ of the present invention obtained in Example 5.

The X-ray diffraction pattern of Sample No. 52 (BaSrCu2O3.7) is shown in FIG. 18. The crystallographic phase of this sample was observed with a transmission electron microscope and the electron diffraction patterns were observed. Sample No. 46 is found to have a crystal structure belonging to a tetragonal system having lattice parameters of a=3.93 and c=7.77. Also found is that the crystal has a two-layered structure in the c-axis. Temperature dependence of the specific resistance of Sample No. 52 is shown in FIG. 19.

FIG. 21 shows an X-ray diffraction pattern of Sample No. 56 (comparative sample).

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

TABLE 8

| Sample No. | Raw Material Powder A | B | High Pressure Treatment Temp. (°C.) | Press. (GPa) | Time | Crystallographic Phase | Lattice Parameter of ABCu2O4 Phase (Å) a | b | c |
|---|---|---|---|---|---|---|---|---|---|
| 44* | BaO | SrO2 | 1,200 | 6 | 2 | BaSrCu2O3.7 | 3.92 | 3.94 | 7.93 |
| 45* | BaO | SrO2 | 1,100 | 4 | 2 | BaSrCu2O3.8 | 3.92 | 3.94 | 7.93 |
| 46* | BaO | SrO2 | 1,000 | 6 | 1 | BaSrCu2O3.9 | 3.92 | 3.94 | 7.93 |
| 47 | BaO2 | SrO2 | 1,000 | 4 | 1 | BaO2, SrCuO2 | | | |
| 48 | BaO2 | SrO | 1,100 | 6 | 1 | BaO2, SrCuO2 | | | |
| 49 | BaO | SrO | 1,000 | 6 | 1 | BaSrCu2Ox, SrO | | | |
| 50* | BaO | SrO2 8H2O | 1,000 | 4 | 1 | BaSrCu2O3.9 | 3.92 | 3.94 | 7.93 |

Example 5

Powders of Ba(NO3)2, Sr(NO3)2 and Cu(NO3)2 were blended with a molar ratio of 1:1:2 and pulverized in a mortar in an inert gas atmsophere. The mixture was evaporated to dryness in an oxygen stream at a temperature of 650°–750° C. for 1–5 hours. The resulting prod-

TABLE 9

| Sample No. | Raw Material Powder A | B | High Pressure Treatment Temp. (°C.) | Press. (GPa) | Time | Crystallographic Phase | Lattice Parameter of ABCu2O4 Phase (Å) a | b | c |
|---|---|---|---|---|---|---|---|---|---|
| 51* | Ba(NO3)2 | Sr(NO3)2 | 1,200 | 6 | 2 | BaSrCu2O3.6 | 3.93 | 3.93 | 7.77 |
| 52* | Ba(NO3)2 | Sr(NO3)2 | 1,100 | 5 | 2 | BaSrCu2O3.7 | 3.93 | 3.93 | 7.77 |
| 53* | Ba(NO3)2 | Sr(NO3)2 | 1,000 | 6 | 1 | BaSrCu2O3.7 | 3.93 | 3.93 | 7.77 |
| 54 | Ba(NO3)2 | Sr(NO3)2 | 1,000 | 3 | 1 | BaCuO2, SrO | | | |
| 55 | Ba(NO3)2 | Sr(NO3)2 | 1,100 | 6 | 1 | BaCuO2, SrO | | | |
| 56 | Ba(NO3)2 | Sr(NO3)2 | 1,000 | 4 | 2 | BaO2, SrCuO2 | | | |

What is claimed is:

1. A superconductive oxide material having the following formula:

$$A_p B_q Cu_2 O_{r \pm r}$$

wherein A represents an element selected from the group consisting of elements belonging to Group IIA of the Periodic Table, B is an element different from element A and selected from the group consisting of elements belonging to Group IIA of the Periodic Table, and p, q and r are numbers in the following ranges:

$$0.9 \leq p \leq 1.1$$

$$0.9 \leq q \leq 1.1$$

$$0 \leq r \leq 0.6$$

said oxide material having a crystal structure which belongs to a tetragonal system of P4/mmm and I-123 and which has the following lattice parameters:

$$3.8 \text{Å} \leq a \leq 4.0 \text{ Å}$$

$$7.6 \text{Å} \leq c \leq 8.0 \text{ Å}$$

said oxide material having an infinite layer structure composed of the following recurring unit:

CuO₂ plane—single layer cation sites A(1)-CuO₂ plane—single layer cation sites A(2),
wherein said cation sites A(1) are occupied solely by element A and cation sites A(2) are occupied solely by element B, and wherein the atomic sites of said infinite layer structure are as follows:

| Atomic Site | Position of Atoms | | |
|---|---|---|---|
| | x | y | z |
| A(1) 1a | 0 | 0 | 0 |
| A(2) 1b | 0 | 0 | 0.5 |
| Cu 2h | 0.5 | 0.5 | 0.25 |
| O 4i | 0 | 0.5 | 0.25. |

2. A superconductive oxide material as claimed in claim 1, wherein elements A and B are Ba and Sr, respectively.

3. A superconductive oxide material as claimed in claim 1 and being a superconductor having the following formula: $BaSrCu_2O_{4.4}$.

4. A superconductive oxide material having the following formula:

$$A_p B_q Cu_2 O_{4 \pm r}$$

wherein A represents an element selected from the group consisting of elements belonging to Group IIA of the Periodic Table, B is an element different from element A and selected from the group consisting of elements belonging to Group IIA of the Periodic Table, and p, q and r are numbers in the following ranges:

$$0.9 \leq p \leq 1.1$$

$$0.9 \leq q \leq 1.1$$

$$0 \leq r \leq 0.6$$

said oxide material having a crystal structure which belongs to an orthorhombic system of Pmmm and I-47 and which has the following lattice parameters:

$$3.8 \text{Å} \leq a \leq 3.95 \text{Å}$$

$$3.82 \text{Å} \leq b \leq 4.0 \text{Å}$$

$$7.6 \text{Å} \leq c \leq 8.0 \text{Å}$$

said oxide material having an infinite layer structure composed of the following recurring unit:

CuO₂ plane—single layer cation site A(1)-CuO₂ plane—single layer cation site A(2),
wherein said cation sites A(1) are occupied solely by element A and cation sites A(2) are occupied solely by element B, and wherein the atomic sites of said infinite layer structure are as follows:

| Atomic Site | | Position of Atoms | | |
|---|---|---|---|---|
| | | x | y | z |
| A(1) | 1a | 0 | 0 | 0 |
| A(2) | 1c | 0 | 0 | 0.5 |
| Cu | 2t | 0.5 | 0.5 | 0.25 |
| O(1) | 2s | 0.5 | 0 | 0.25 |
| O(2) | 2r | 0 | 0.5 | 0.25. |

5. An oxide material as claimed in claim 4, wherein elements A and B are Ba and Sr, respectively.

* * * * *

UNITED STATES PATENT AND TRADEMARK OFFICE
CERTIFICATE OF CORRECTION

PATENT NO. : 5,446,017
DATED : August 29, 1996
INVENTOR(S) : SAKURAI et al

It is certified that error appears in the above-indentified patent and that said Letters Patent is hereby corrected as shown below:

Col. 1, line 10, delete "2.";

line 19, delete "cite" insert --site--;

line 25, delete "ceratin" insert --certain--;

line 27, after "However," insert --a--.

Col. 2, line 17, delete "cites" insert --sites--; and line 63, delete "in", second instance.

Col. 6, line 19, "fiffraction" should read --diffraction--.

Col. 11, line 5, "$A_p B_q Cu_2 O_{r\pm r}$" should read "$A_p B_q Cu_2 O_{4\pm r}$".

UNITED STATES PATENT AND TRADEMARK OFFICE
CERTIFICATE OF CORRECTION

PATENT NO. : 5,446,017
DATED : August 29, 1996
INVENTOR(S) : SAKURAI et al.

It is certified that error appears in the above-indentified patent and that said Letters Patent is hereby corrected as shown below:

Col. 12, line 49, delete "An" insert --A superconductive--.

Signed and Sealed this

Sixth Day of August, 1996

*Attest:*

BRUCE LEHMAN

*Attesting Officer*   Commissioner of Patents and Trademarks

UNITED STATES PATENT AND TRADEMARK OFFICE
CERTIFICATE OF CORRECTION

PATENT NO. : 5,446,017
DATED : August 29, 1995
INVENTOR(S) : SAKURAI et al

It is certified that error appears in the above-indentified patent and that said Letters Patent is hereby corrected as shown below:

Title page, item [73] "Assignees: Central Research Institute of Electric Power Industry; Tohoku Electric Power Co., Inc.; International Superconductivity Technology Center, all of Japan" should read --Assignees: Tohoku Electric Power Co., Inc. and International Superconductivity Technology Center, both of Japan--.

Signed and Sealed this

Twenty-ninth Day of July, 1997

Attest:

BRUCE LEHMAN

*Attesting Officer*    *Commissioner of Patents and Trademarks*